United States Patent [19]
Hashimoto

[11] Patent Number: 5,936,910
[45] Date of Patent: Aug. 10, 1999

[54] SEMICONDUCTOR MEMORY DEVICE HAVING BURN-IN TEST FUNCTION

[75] Inventor: Hiroaki Hashimoto, Tokyo, Japan

[73] Assignee: NEC Corporation, Tokyo, Japan

[21] Appl. No.: 09/120,507

[22] Filed: Jul. 23, 1998

[30] Foreign Application Priority Data

Jul. 25, 1997 [JP] Japan ..................................... 9-215920

[51] Int. Cl.$^6$ .................................................. G11C 7/00
[52] U.S. Cl. ...................... 365/230.06; 365/201; 365/226
[58] Field of Search ............................... 365/230.06, 201, 365/226

[56] References Cited

U.S. PATENT DOCUMENTS

| 4,751,683 | 6/1988 | Wada et al. .......................... 365/233 X |
| 5,590,079 | 12/1996 | Lee et al. ......................... 365/230.06 X |
| 5,608,674 | 3/1997 | Yabe et al. ........................... 365/221 X |

FOREIGN PATENT DOCUMENTS

| 6-76599 | 3/1994 | Japan . |
| 7-244998 | 9/1995 | Japan . |
| 7-282598 | 10/1995 | Japan . |

*Primary Examiner*—Do Hyun Yoo
*Attorney, Agent, or Firm*—Sughrue, Mion, Zinn, Macpeak & Seas, PLLC

[57] ABSTRACT

In a semiconductor memory device including a plurality of word lines connected to memory cells, a word line level generating circuit for generating a suitable word line level generating voltage higher than a power supply voltage and a plurality of word line drivers, each for driving one of the word lines using the word line level generating voltage a plurality of row decoders activate a first number of the word line drivers in a usual mode and activate a second number of the word line drivers in a burn-in test mode. The second number is larger than the first number. A control circuit detects the word line level generating voltage and uses feedback to control the voltage to a definite level.

8 Claims, 11 Drawing Sheets

SEMICONDUCTOR MEMORY DEVICE HAVING BURN-IN TEST FUNCTION

BACKGROUND OF THE INVENTION

1. Field of the Invention

The present invention relates to a semiconductor memory device such as a dynamic random access memory (DRAM) device having a burn-in test function.

2. Description of the Related Art

In a semiconductor memory device, before its shipment, a burn-in test is carried out to stabilize the characteristics and reveal defects.

In such a burn-in test, a power supply voltage such as 7V which is higher than a usual power supply voltage such as 5V is applied to a semiconductor memory device for a long time such as about 8 to 10 hours. The higher the power supply voltage, the larger the screening effect. Also, the longer the burn-in test time, the larger the screening effect.

In a burn-in test, since peripheral circuits entirely operate at each cycle, sufficient stress is applied thereto. On the other hand, since only selected memory cells operate at each cycle, stress applied thereto is not sufficient. For example, in a 16 Mbit-DRAM device, stress is applied to only ½₀₀₀ of memory cells.

Therefore, to order to enhance the screening effect of the burn-in test, a larger number of memory cells are simultaneously selected using a voltage higher than a power supply voltage, which also reduces the burn-in test time (see: JP-A-6-76599). This will be explained later in detail.

In the above-mentioned prior art semiconductor memory device, however, since there is no means for detecting such a high voltage, if the voltage at the word lines is so high that too large a stress is applied to the memory cells. In this case, larger stress is applied to the peripheral circuit of the device. On the contrary, if the voltage at the word lines is too low due to the large number of the simultaneously driven word lines, the capacity of a word line level generating circuit needs to be larger, which decreases the integration.

SUMMARY OF THE INVENTION

It is an object of the present invention to provide a semiconductor memory device capable of carrying out a burn-in test function using a suitable power supply voltage, thus reducing the test time.

According to the present invention, in a semiconductor memory device including a plurality of word lines connected to memory cells, a word line level generating circuit for generating a suitable word line level generating voltage higher than a power supply voltage, and a plurality of word line drivers each for driving one of the word lines using the word line level generating voltage a plurality of row decoders activate a first number of the word line drivers in a usual mode and activate a second number of the word line drivers in a burn-in test mode. The second number is larger than the first number. A control circuit detects the word line level generating voltage and uses feedback to control the voltage to a definite level.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor memory devices having a burn-in test function will be explained with reference to FIGS. 1A, 1B, 2, 3 and 4.

Figure 1A:
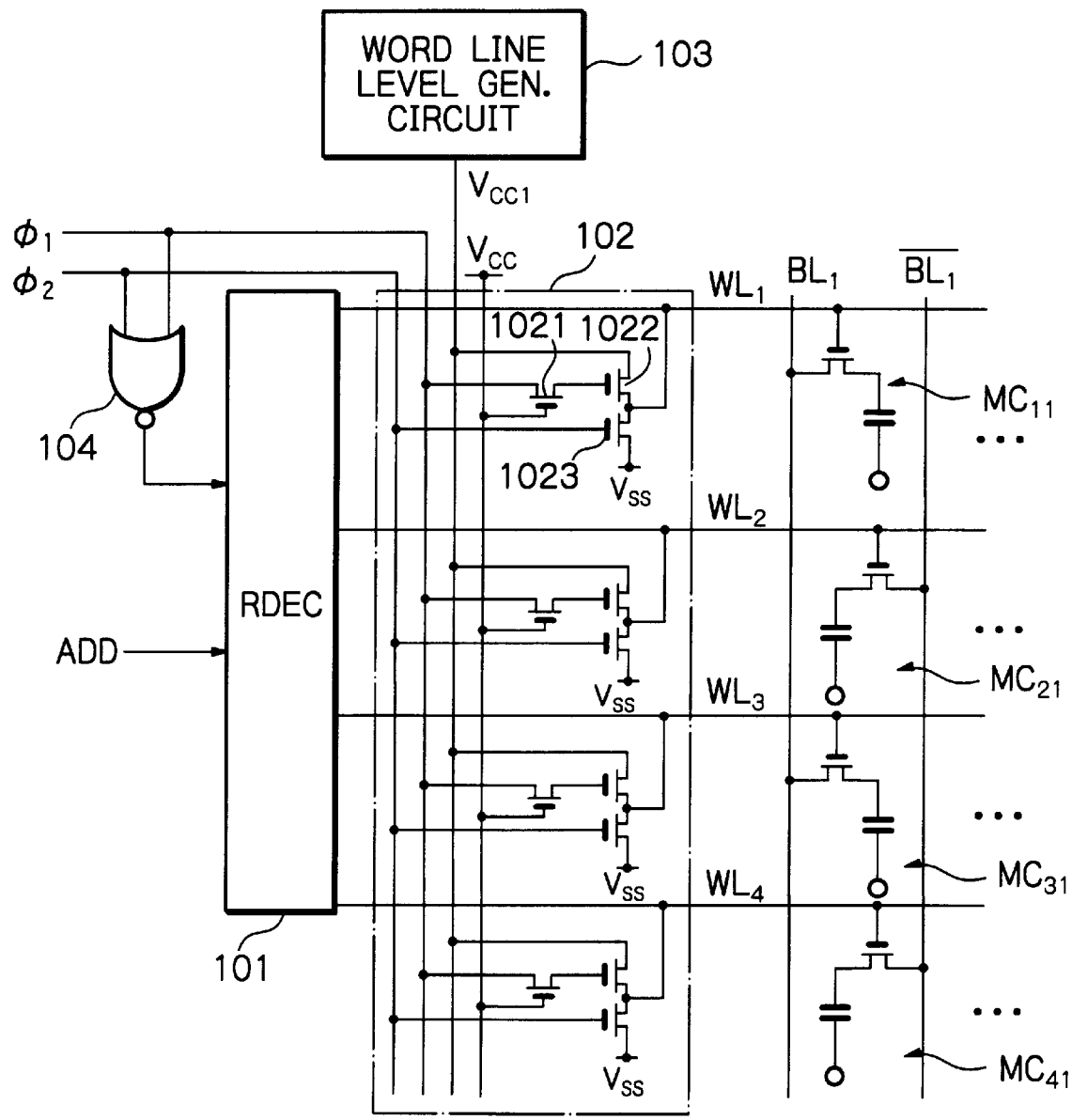
FIG. 1A is a circuit diagram illustrating a first prior art semiconductor memory device.

In FIG. 1A, which illustrates a first prior art semiconductor memory device (see FIG. 2 of JP-A-6-76599), one-transistor, one-capacitor type memory cells such as $MC_{11}$ are connected between word lines $WL_1$, $WL_2$, . . . and bit line pairs such as $BL_1$ and $\overline{BL_1}$.

In a usual mode, one of the word lines $WL_1$, $WL_2$, . . . is selected by a row decoder 101 for receiving a row address signal ADD.

In a burn-in test mode, all the word lines $WL_1$, $WL_2$, . . . are selected by a test circuit 102 for receiving test signal $\phi_1$ and $\phi_2$. A power supply voltage $V_{CC}$ is applied to the test circuit 102, and also, a high power supply voltage $V_{CC1}$ ($>V_{CC}$) generated by a word line level generating circuit 103 is applied to the test circuit 102.

In a usual mode where the test signals $\phi_1$ and $\phi_2$ are both low, the output signal of a NOR circuit 104 is high, to activate the row decoder 101. Thus, one of the word lines $WL_1$, $WL_2$, . . . is selected and is caused to be high. In this case, in the test circuit 102, a transistor 1022 is turned OFF by the test signal $\phi_1$ through a transistor 1021 and a transistor 1023 is turned OFF by the test signal $\phi_2$. Thus, the test circuit 102 is deactivated.

In a test mode, first, the test signals $\phi_1$ and $\phi_2$ are both made high, and thereafter, only the test signal $\phi_2$ is made low. As a result, the output signal of the NOR circuit 104 is low, to deactivate the row decoder 101. In this case, in the test circuit 102, first, the drain voltage of the transistor 1023 is 0V (=$V_{SS}$) and the gate voltage of the transistor 1022 is $V_{CC}-V_{TH}$ where $V_{TH}$ is a threshold voltage of the N-channel transistor 1021. Next, when the test signal $\phi_2$ is made low, the drain voltage of the transistor 1023 is pulled up so as to increase the gate voltage of the transistor 1022 due to the gate-source capacitive coupling. As a result, the gate voltage of the transistor 1022 becomes considerably higher than $V_{CC}$, and therefore, the high power supply voltage $V_{CC1}$ is applied via the transistor 1022 to the word line $WL_1$ as well as the word lines $WL_2$, $WL_3$, . . . . Thus, all the word lines WL$_1$, WL$_2$, . . . are selected using the high power supply voltage V$_{CC1}$, carrying out a burn-in test.

In the semiconductor memory device of FIG. 1A, since all the word lines are simultaneously selected in a burn-in test, the test time can be reduced.

Figure 1B:
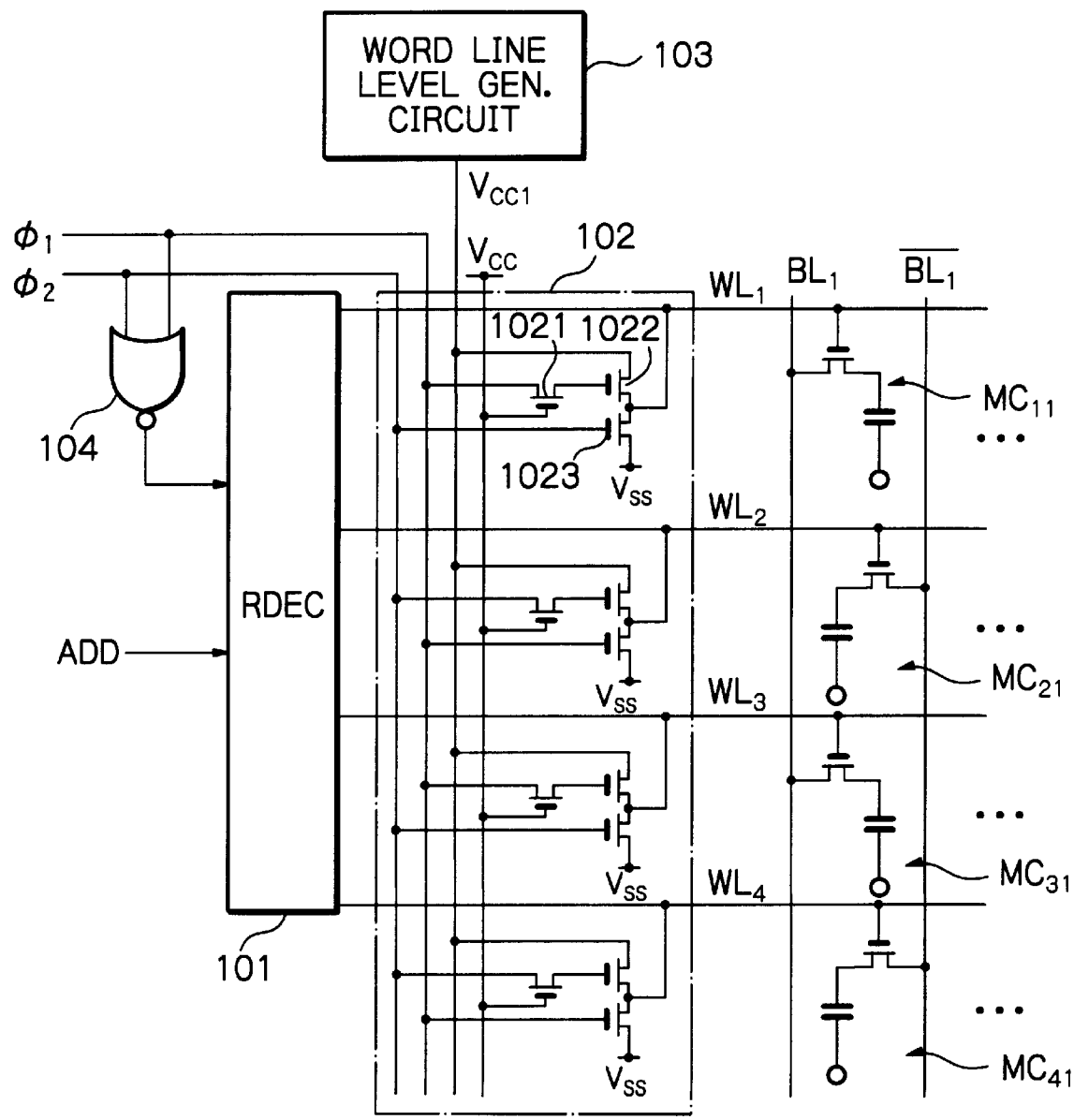
FIG. 1B is a circuit diagram illustrating a modification of the device of FIG. 1A.

In FIG. 1B, which is a modification of the semiconductor memory device of FIG. 1A, in a burn-in test mode, only two of the word lines WL$_1$, WL$_2$, WL$_3$ and WL$_4$ are selected using the high power supply voltage V$_{CC1}$ (see FIG. 1 of JP-A-6-76599). That is, in a first mode where the test signals φ$_1$ and φ$_2$ are both made high and thereafter, only the test signal φ$_2$ is made low, the word lines WL$_1$ and WL$_3$ are selected using the high power supply voltage V$_{CC1}$. On the other hand, in a second mode where the test signals φ$_1$ and φ$_2$ are both made high and thereafter, only the test signal φ$_1$ is made low, the word lines WL$_2$ and WL$_4$ are selected using the high power supply voltage V$_{CC1}$.

In the semiconductor memory device of FIG. 1B, since a plurality of word lines are simultaneously selected in a burn-in test, the test time can also be reduced.

Figure 2:
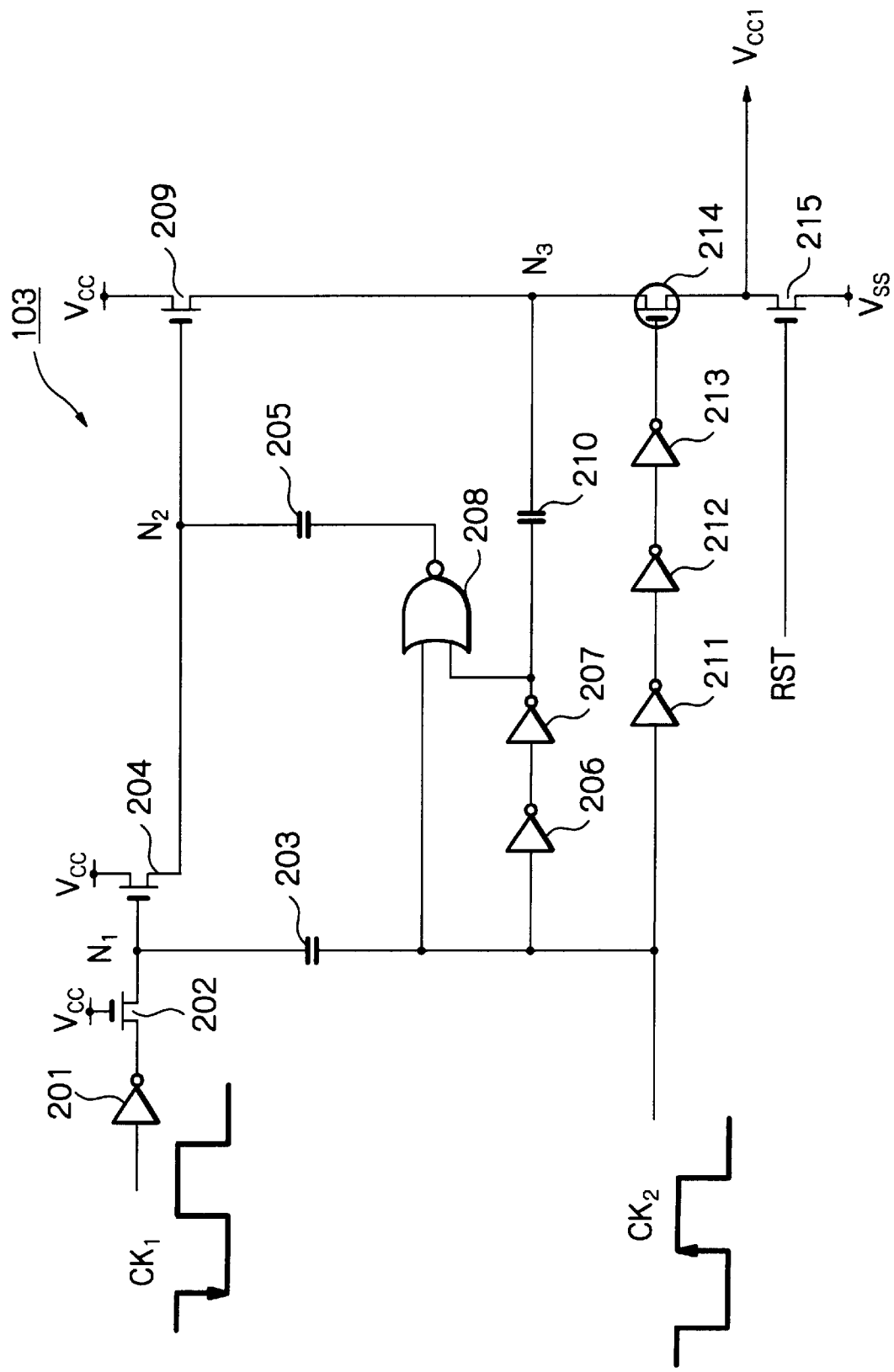
FIG. 2 is a circuit diagram of the word line level generating circuit of FIGS. 1A and 1B.

In FIG. 2, which is a detailed circuit diagram of the word line level generating circuit 103 of FIGS. 1A and 1B, CK$_1$ and CK$_2$ are clock signals, and RST is a reset signal. First, the clock signal CK$_1$ is made low, so that a voltage at node N$_1$ is caused by an inverter 201 and an N-channel transistor 202 to be V$_{CC}$−V$_{TH}$. Next, the clock signal CK$_2$ is made high, so that the voltage at the node N$_1$ is pulled up by the capacitive coupling of the capacitor 203. Therefore, an N-channel transistor 204 is turned ON to increase a voltage at a node N$_2$ to V$_{CC}$. Thereafter, the voltage at the node N$_2$ is pulled up by the capacitive coupling of a capacitor 205 using the clock signal CK$_2$ through inverters 206 and 207 and a NOR circuit 208. Therefore, the transistor 209 is turned ON, so that a voltage V at a node N$_3$ becomes V$_{CC}$. Further, the voltage at the node N$_3$ is pulled up to a level higher than V$_{CC}$ by a capacitive coupling of a capacitor 210. In this case, the clock signal CK$_2$ is transmitted via inverters 211, 212 and 213 to a P-channel transistor 214, so that the transistor 214 is turned ON. As a result, the high voltage at the node N$_3$ is generated as the high power supply voltage V$_{CC1}$.

Thus, the voltage V$_{CC1}$ is stepwisely increased by the clock signals CK$_1$ and CK$_2$.

Note that if the high power supply voltage V$_{CC1}$ is required to be pulled down, the reset signal RST is made high.

In the semiconductor memory device of FIG. 1A or 1B, however, since there is no means for detecting the high power supply voltage V$_{CC1}$ generated from the word line level generating circuit 103, if the voltage at the word lines WL$_1$, WL$_2$, . . . is too high, too large a stress is applied to the memory cells such as MC$_{11}$. In this case, larger stress is applied to the peripheral circuit of the device. On the contrary, if the voltage at the word lines WL$_1$, WL$_2$, . . . is too low due to the large number of the simultaneously driven word lines, the capacity of the capacitors 203, 205 and 210 of the word line level generating circuit 103 needs to be larger, which decreases the integration.

Figure 3:
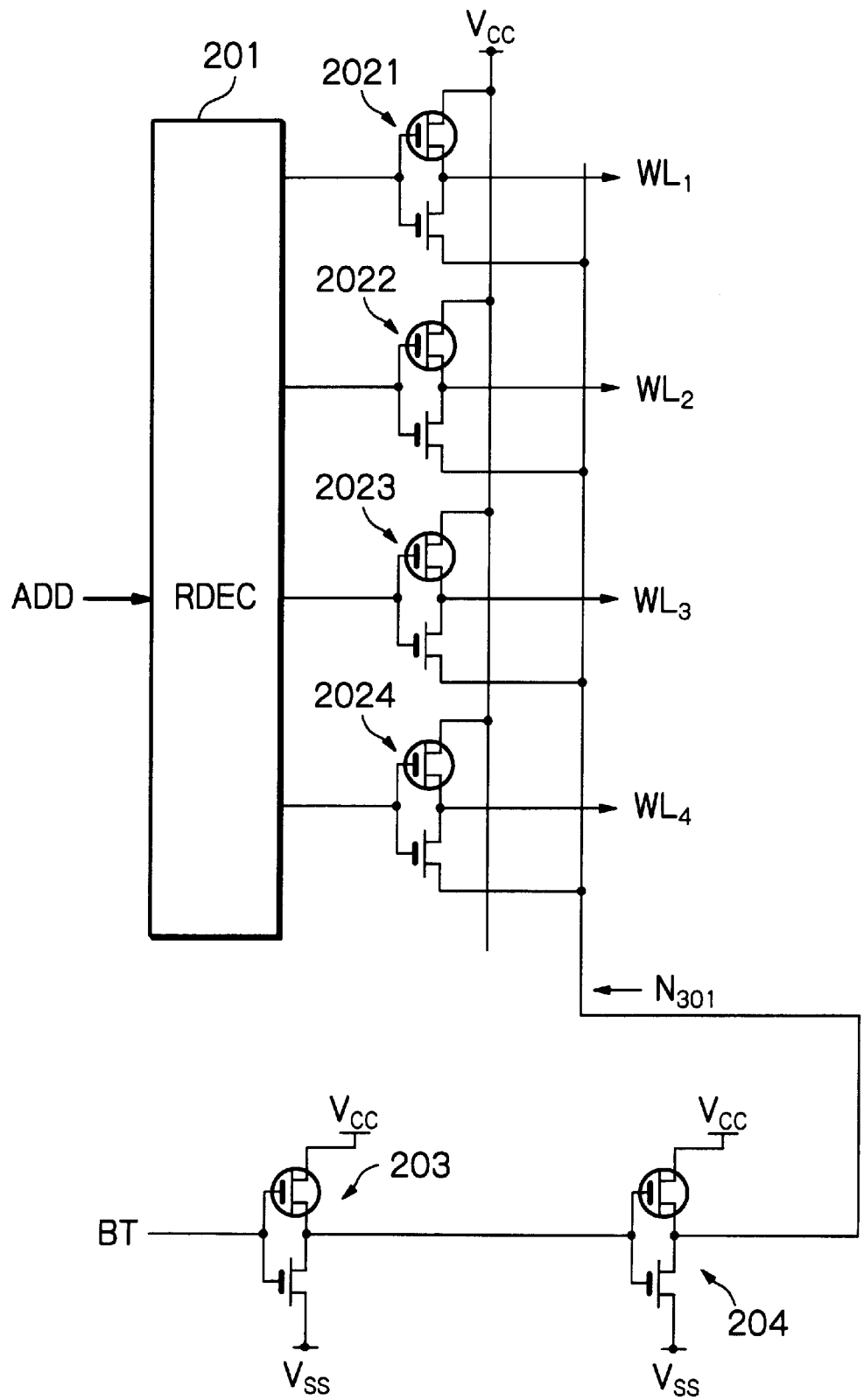
FIG. 3 is a circuit diagram illustrating a second prior art semiconductor memory device.

In FIG. 3, which illustrates a second prior art semiconductor memory device (see JP-A-7-244998), word line drivers 2021, 2022, . . . are connected between a row address decoder 201 and word lines WL$_1$, WL$_2$, . . . . Each of the word line drivers 2021, 2022, . . . is constructed by an inverter formed by a P-channel transistor and an N-channel transistor and is connected between a terminal for a power supply voltage V$_{CC}$ and a node N$_{301}$. A burn-in test signal BT is supplied via two inverters 203 and 204 each formed by a P-channel transistor and an N-channel transistor to the node N$_{301}$.

In a usual mode where the burn-in test signal BT is low, the voltage at the node N$_{301}$ is made 0V (=V$_{SS}$) As a result, one of the word lines WL$_1$, WL$_2$, is selected and is caused to be high (=V$_{CC}$)

In a burn-in test mode where the burn-in test signal BT is high, the voltage at the node N$_{301}$ is made high (=V$_{CC}$). As a result, all the word lines WL$_1$, WL$_2$, . . . are selected and are caused to be high (=V$_{CC}$ ). Thus, the test time can be reduced.

In the semiconductor memory device of FIG. 3, however, since the voltages at the word lines WL$_1$, WL$_2$, . . . during a burn-in test mode are V$_{CC}$ at the highest, the screening effect of the burn-in test is small.

Figure 4:
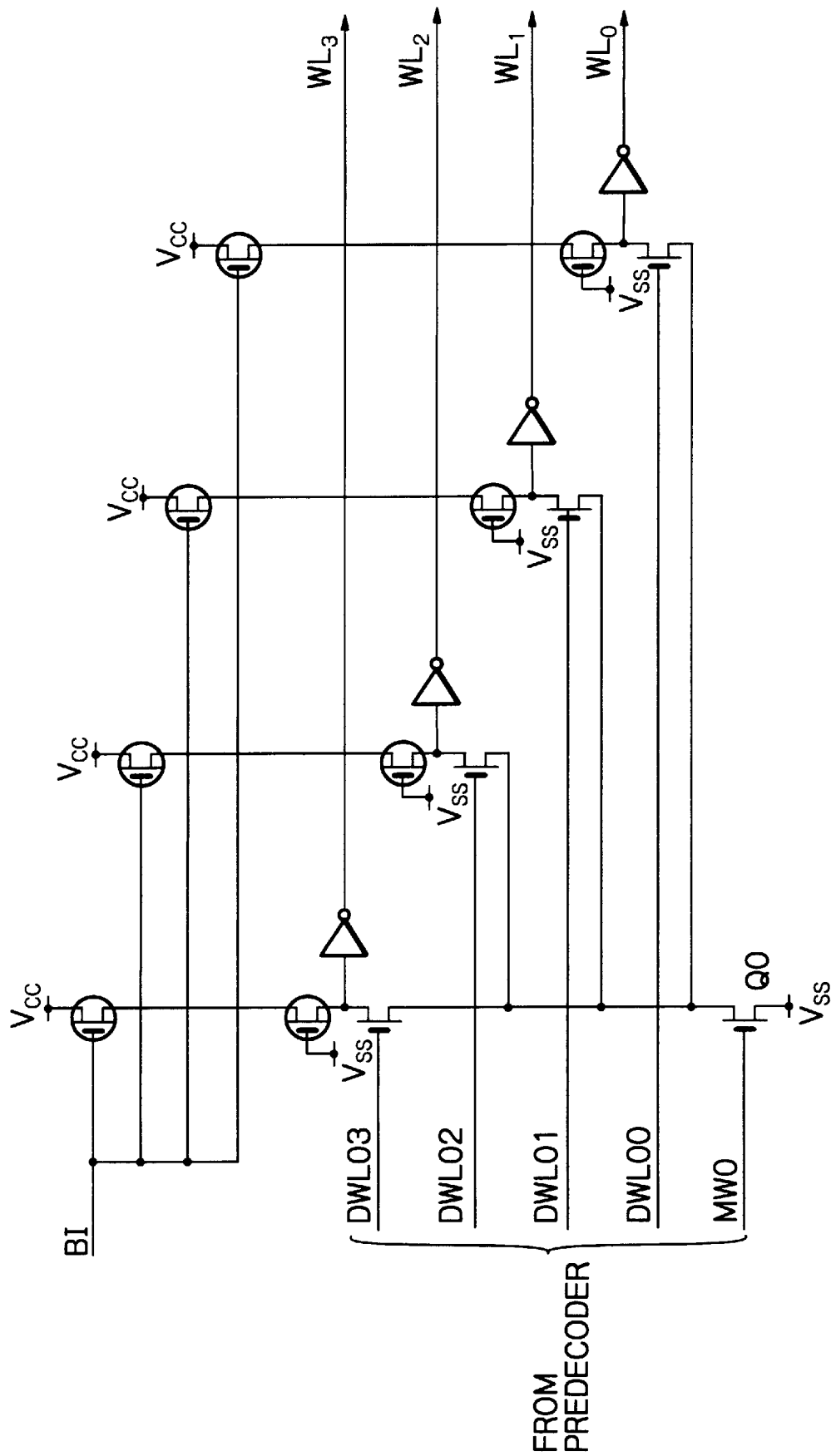
FIG. 4 is a circuit diagram illustrating a third prior art semiconductor memory device.

In FIG. 4, which illustrates a third prior art semiconductor memory device (see JP-A-7-282598), a main row decoder is illustrated. That is, DWLi0, DWLi1, DWLi2 and DWLi3, where only i=0 is illustrated, are word line signals driven by two lower bits of a row address in a row address predecoder, and MWi, where only i=0 is illustrated, is a word line signal driven by the other upper bits of the row address in the row address predecoder.

In a usual mode where the burn-in test signal BT is low, one of the word line signals MWi and one of the word line signals DWLi0, DWLi1, DWLi2 and DWLi3 are selected and are caused to be high (=V$_{CC}$) in the row address predecoder. As a result, one of the word lines WL$_1$, WL$_2$, . . . is selected and is caused to be high (=V$_{CC}$).

In a burn-in test mode where the burn-in test signal BT is high, all of the word line signals MWi and all of the word line signals DWLi0, DWLi1, DWLi2 and DWLi3 are selected and are caused to be high (=V$_{CC}$) in the row address predecoder. As a result, all the word lines WL$_0$, WL$_1$, . . . are selected and are caused to be high (=V$_{CC}$) Thus, the test time can be reduced.

In the semiconductor memory device of FIG. 4, however, since the voltages at the word lines WL$_1$, WL$_2$, . . . during a burn-in test mode are V$_{CC}$ at the highest, the screening effect of the burn-in test is small.

Figure 5:
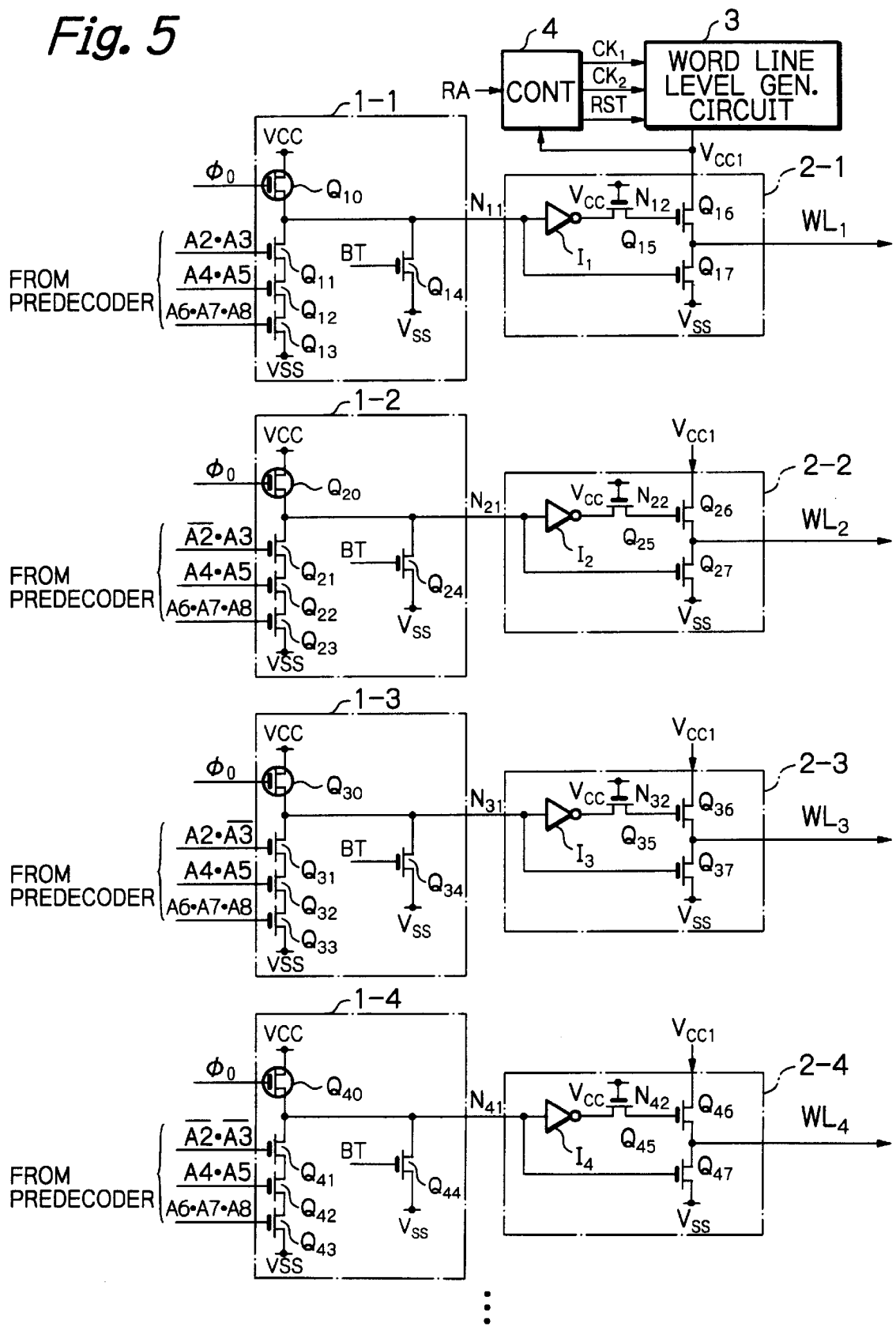
FIG. 5 is a circuit diagram illustrating a first embodiment of the semiconductor memory device according to the present invention.

In FIG. 5, which illustrates a first embodiment of the semiconductor memory device according to the present invention, reference numerals 1-1, 1-2, designate row address decoders for receiving row address signals A2 (or $\overline{A2}$), A3 (or $\overline{A3}$), . . . , A8 (or $\overline{A8}$), and 2-1, 2-2, . . . , designate word line drivers each connected to one of the row address decoders. The row address decoders 1-1, 1-2, . . . are activated by a row decoder activation signal φ$_0$.

Also, a higher power supply voltage V$_{CC1}$, (>V$_{CC}$) is supplied by a word line level generating circuit 3 to the word line drivers 2-1, 2-2, . . . . The word line level generating circuit 3 has the same configuration as the word line level generating circuit of FIG. 2. In this case, the word line level generating circuit 3 is controlled by a control circuit 4 which detects the power supply voltage V$_{CC1}$, so that the power supply voltage V$_{CC}$ is brought close to a definite level. In other words, when the control circuit 4 receives an active internal row address strobe (RAS) signal or the like, the control circuit 4 generates the clock signals CK$_1$ and CK$_2$ to activate the word line level generating circuit 3. On the other hand, when the power supply voltage V$_{CC1}$ reaches the above-mentioned definite level, the control circuit 4 stops the generation of the clock signals CK$_1$ and CK$_2$, so that the power supply voltage V$_{CC1}$ is maintained at the definite level.

The row address decoder such as 1-1 is formed by a P-channel transistor $Q_{10}$ for receiving the row decoder activation signal $\phi_0$, an N-channel transistor $Q_{11}$ for receiving a signal A2 . A3, an N-channel transistor $Q_{12}$ for receiving a signal A4 . A5, an N-channel transistor $Q_{13}$, and an N-channel transistor $Q_{14}$ for receiving a burn-in test signal BT. Also, the word line driver such as 2-1 is constructed by an inverter $I_1$, an N-channel transistor $Q_{15}$, and serially-connected N-channel transistors $Q_{16}$ and $Q_{17}$ powered by the voltages $V_{CC1}$ and $V_{SS}$.

In a usual mode where the burn-in test signal BT is low, the transistors $Q_{14, Q24}$, . . . are turned OFF. Therefore, under the condition that the row decoder activation signal $\phi_0$ is low, if A2·A3="1"(high), A4·A5="1", and A6·A7·A8="1", then, the transistors $Q_{11}$, $Q_{12}$ and $Q_{13}$ are turned ON, so that the voltage at a node $N_{11}$ is pulled down to 0V. As a result, the voltage at a node $N_{12}$ becomes $V_{CC}-V_{TH}$. In this state, since the transistor $Q_{17}$ is turned OFF, the voltage at the node $N_{12}$ is pulled up to a level higher than $V_{CC}$. As a result, the word line $WL_1$ is driven by the high power supply voltage $V_{CC1}$, thus selecting the word line $WL_1$. Similarly, under the condition that the row decoder activation signal $\phi_0$ is low, if A2·A3="1"(high), A4·A5="1", and A6·A7·A8="1", then, the transistors $Q_{21}$, $Q_{22}$ and $Q_{23}$ are turned ON, so that the voltage at a node $N_{21}$ is pulled down to 0V. As a result, the voltage at a node $N_{22}$ becomes $V_{CC}-V_{TH}$. In this state, since the transistor $Q_{27}$ is turned OFF, the voltage at the node $N_{22}$ is pulled up to a level higher than $V_{CC}$. As a result, the word line $WL_2$ is driven by the high power supply voltage $V_{CC1}$, thus selecting the word line $WL_2$.

Thus, in a usual mode, only one of the word lines $WL_1$, $WL_2$, . . . is selected using the power supply voltage $V_{CC1}$.

In a burn-in test mode when the burn-in test signal BT is high, the transistors $Q_{14}$, $Q_{24}$, are turned ON. Therefore, the voltages at the nodes $N_{11}$, $N_{21}$, are pulled down to 0V, regardless of the address signals A2, A3, . . . , A8. As a result, the voltages at the nodes $N_{12}$, $N_{22}$, become $V_{CC}-V_{TH}$. In this state, since the transistors $Q_{17}$, $Q_{27}$ . . . are turned OFF, the voltages at the nodes $N_{12}$, $N_{22}$ . . . are pulled up to a level higher than $V_{CC}$. As a result, all the word line $WL_1$, $WL_2$, . . . are driven by the high power supply voltage $V_{CC1}$, thus selecting all the word lines $WL_1$, $WL_2$, . . . .

Thus, in a burn-in test mode, all the word lines $WL_1$, $WL_2$, . . . are selected using the power supply voltage $V_{CC1}$.

Figure 6:
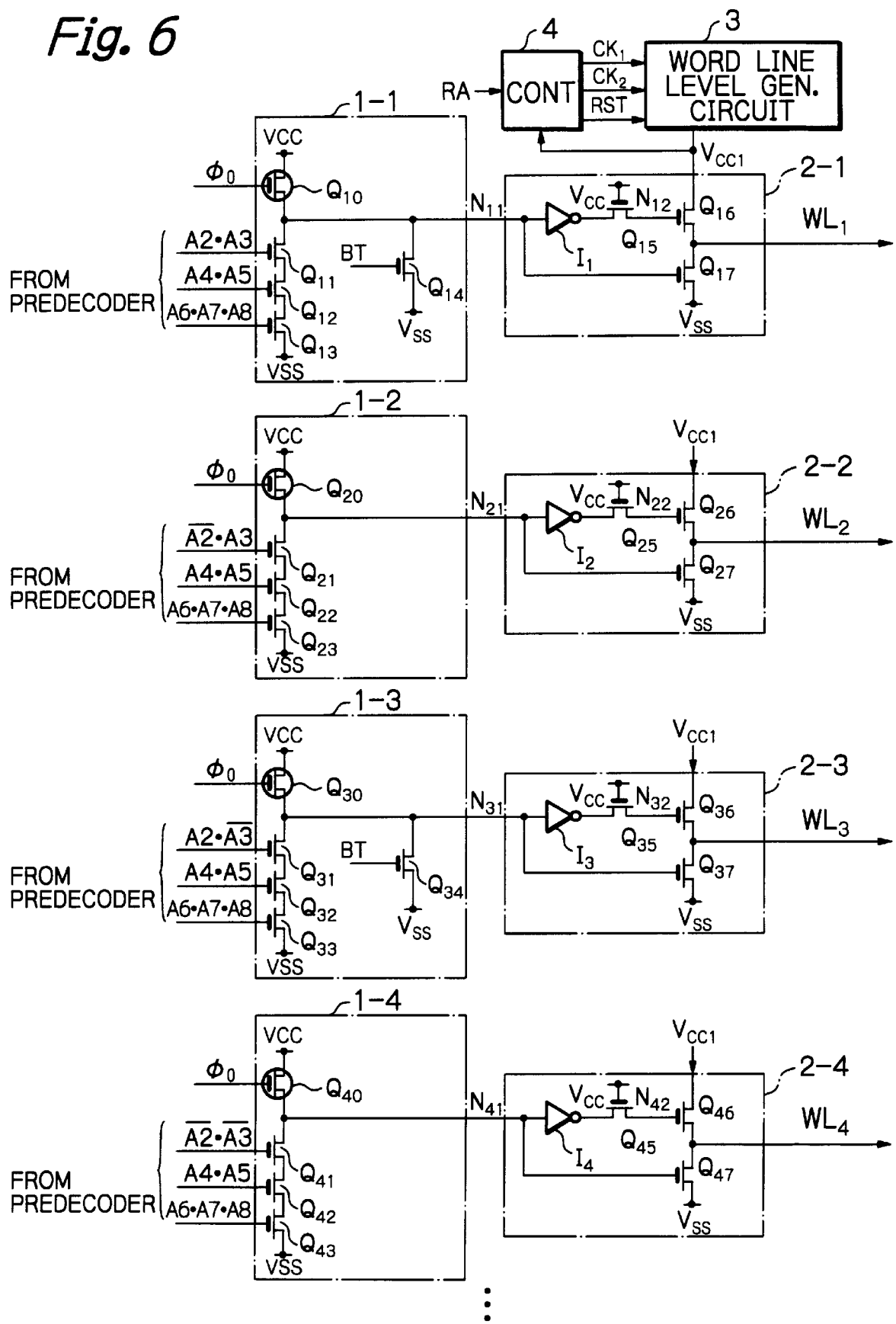
FIG. 6 is a circuit diagram illustrating a modification of the device of FIG. 5.

Note that the burn-in test cycle is usually about several hundreds of μs. Therefore, even if the capacity of the word line level generating circuit 3 is small, the voltage $V_{CC1}$ can reach a level required for the screening effect in several tens of μs. Therefore, the number of word lines is determined in view of a required burn-in test cycle and the time required for a burn-in load. For example, as illustrated in FIG. 6, only the word lines $WL_1$, $WL_3$, . . . can be selected using the power supply voltage $V_{CC1}$ in a burn-in test. That is, the number of simultaneously driven word lines in a burn-in test is changed, so that the stress on the word lines can be the same as the stress on the peripheral circuit.

Figure 7:
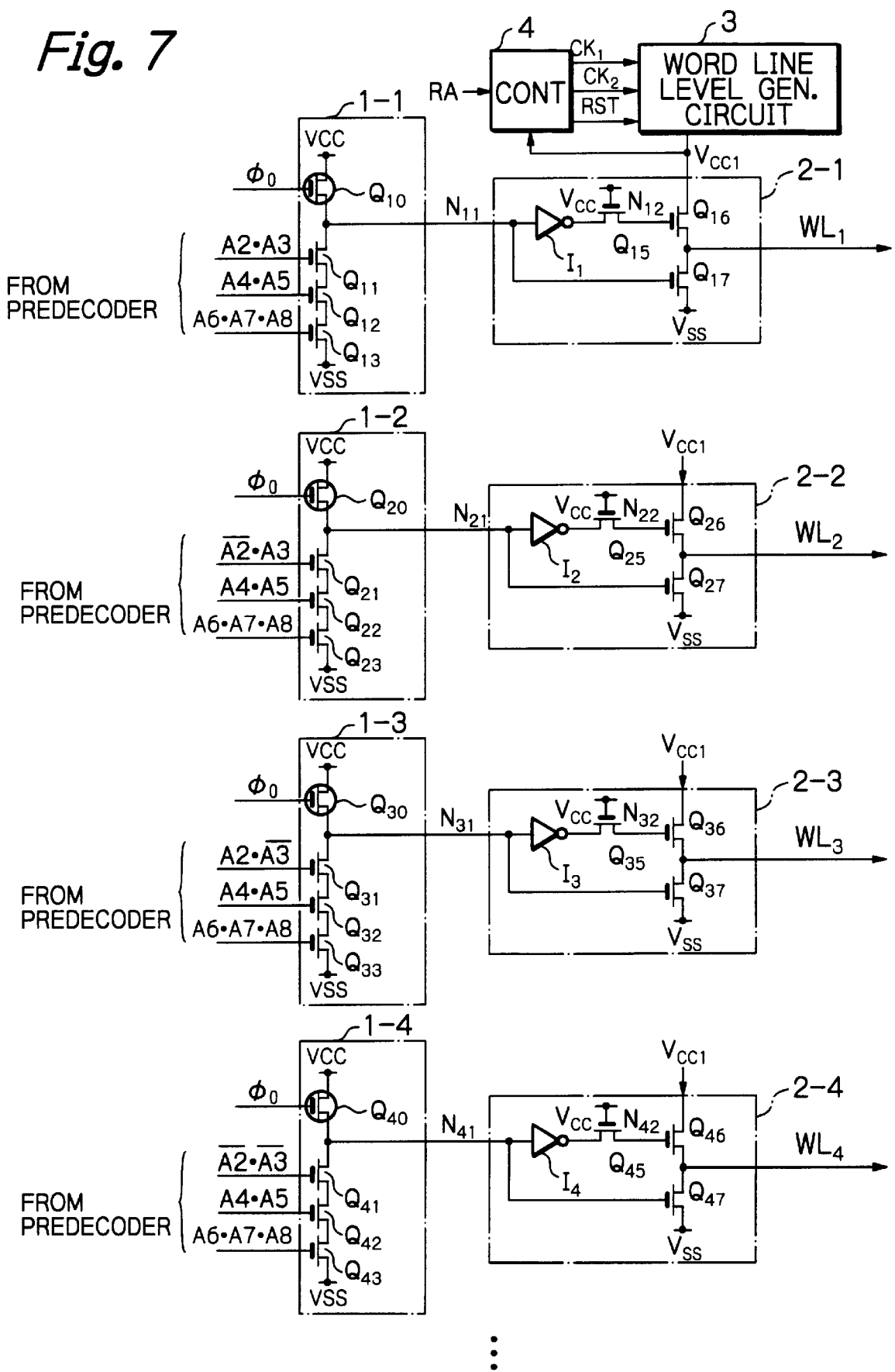
FIG. 7 is a circuit diagram illustrating a second embodiment of the semiconductor memory device according to the present invention.
Figure 8:
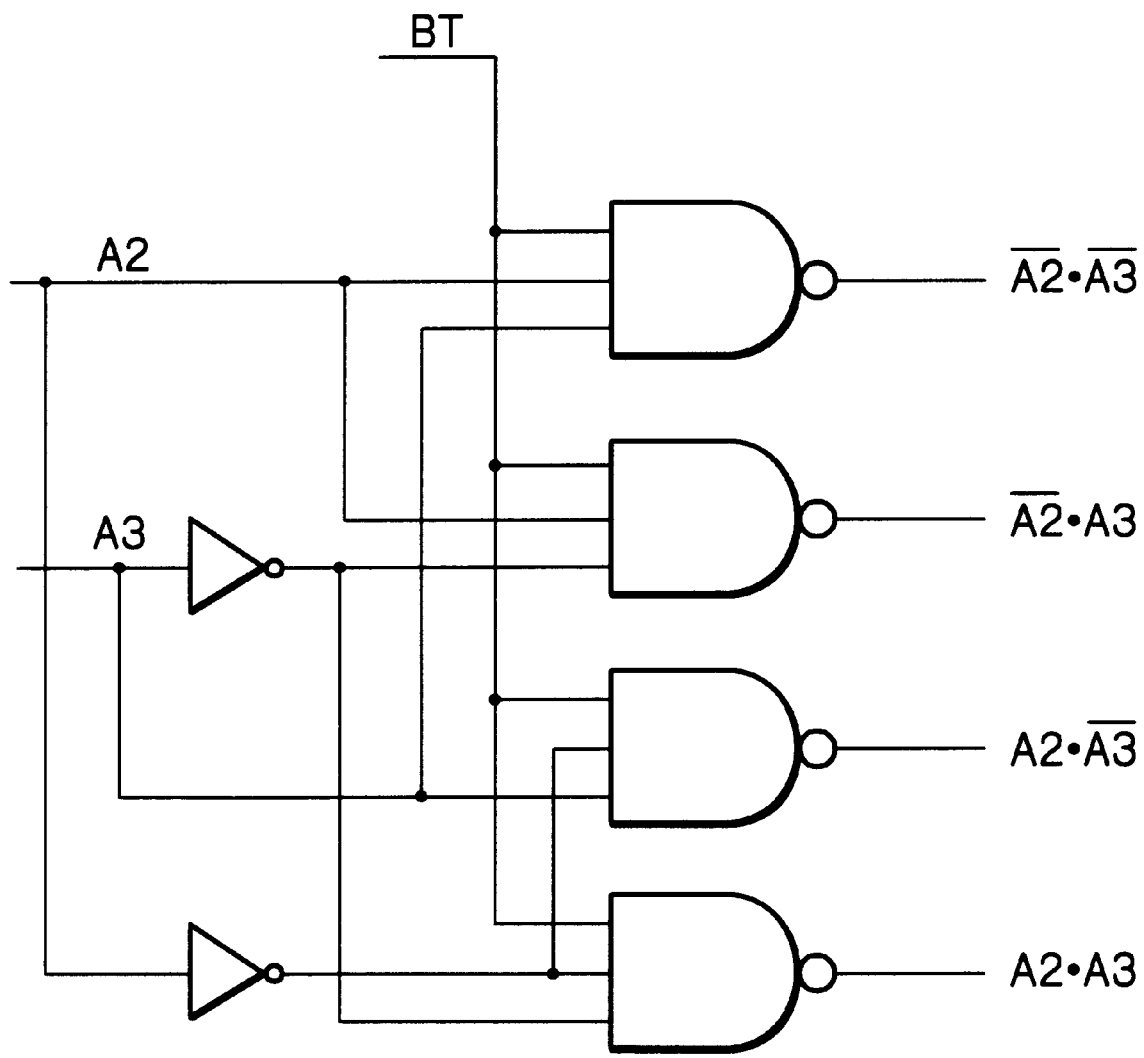
FIGS. 8 and 9 are a circuit diagram illustrating row predecoders included in the device of FIG. 7.

In FIG. 7, which illustrate a second embodiment of the semiconductor memory device according to the present invention, the transistors $Q_{14}$, $Q_{24}$, . . . of FIG. 5 are omitted. Also, as illustrated in FIG. 8, the burn-in test signal BT is introduced into the row address predecoder. In FIG. 8, in a usual mode, where the burn-in test signal BT is high, only one of the signals $\overline{A2 \cdot A3}$, $\overline{A2} \cdot A3$, $A2 \cdot \overline{A3}$ and $A2 \cdot A3$ is high. Therefore, only one of the word lines $WL_1$, $WL_2$, . . . is selected. On the other hand, in a burn-in test mode where the burn-in test signal BT is low, all the signals $\overline{A2 \cdot A3}$, $\overline{A2} \cdot A3$, $A2 \cdot \overline{A3}$ and $A2 \cdot A3$ are high. Therefore, under the condition that A4·A5=A6·A7·A8="1", only the word lines $WL_1$, $WL_2$, $WL_3$ and $WL_4$ are selected.

Figure 9:
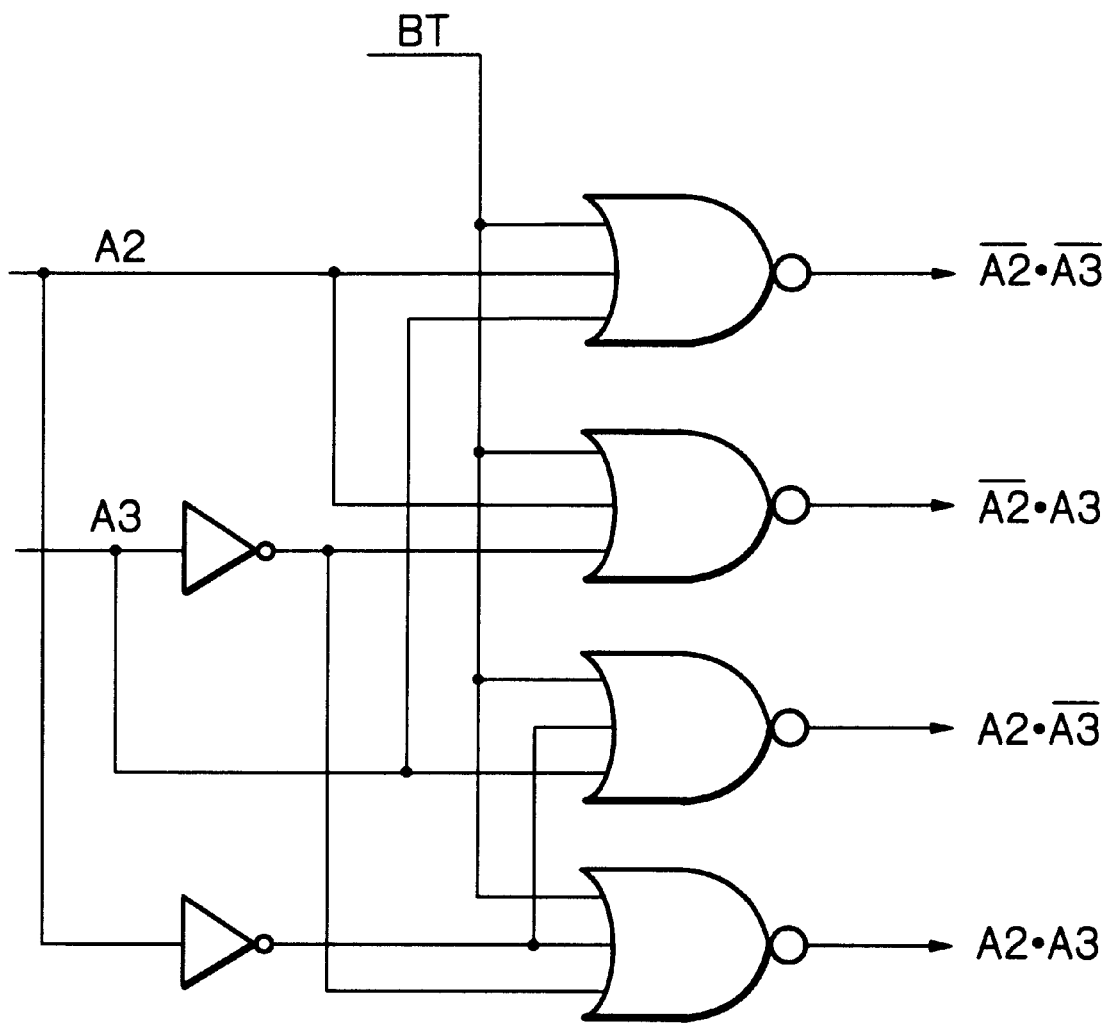
Figure 10:
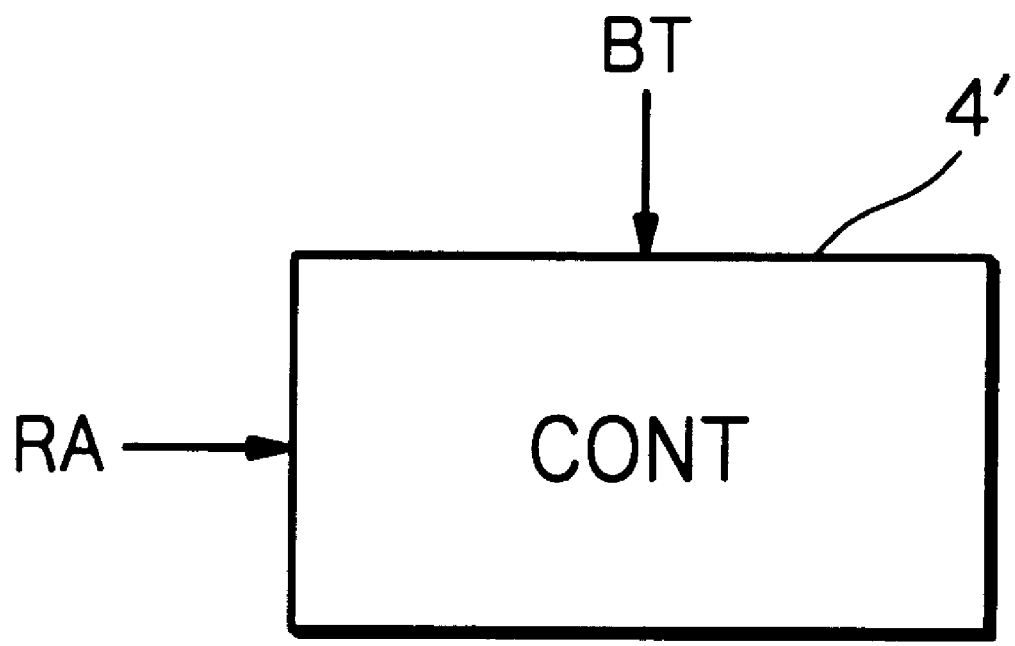
FIG. 10 is a block circuit diagram of a modification the control circuit of FIGS. 5, 6 and 7.

In FIG. 9, which is a modification of the circuit, of FIG. 8, the circuit of FIG. 9 operates in the same way as the circuit of FIG. 8.

In FIGS. 8 and 9, note the signals A2 and A3 can be arbitrarily replaced by the signals A4 and A5. Also, the circuits of FIGS. 8 and 9 can be applied to the signals A6, A7 and A8.

Also, in FIGS. 5, 6 and 7, the control circuit 4 is modified into a control circuit 4' that receives the burn-in test signal BT. That is, when the burn-in test signal BT is high, the control circuit 4' increases the power supply voltage $V_{CC1}$, thus enhancing the screening effect.

In addition, the above-mentioned embodiments can be applied to redundancy word lines.

As explained hereinabove, according to the present invention in a burn-in test mode, since a plurality of word lines are selected using a suitable power supply voltage, the test time can be reduced thus reducing the sampling inspection cost.

I claim:

1. A semiconductor memory device comprising:

first and second power supply terminals;

a plurality of word lines connected to memory cells;

a word line level generating circuit for generating a word line level generating voltage higher than a power supply voltage at said first power supply terminal;

a control circuit, connected to said word line level generating circuit, for detecting and feeding said word line level generating voltage back to a definite level;

a plurality of word line drivers, each connected to one of said word lines and said word line level generating circuit, each of said word line drivers driving one of said word lines using said word line level generating voltage; and a plurality of row decoders, each connected to one of said word line drivers, for activating a first number of said word line drivers in a usual mode and activating a second number of said word line drivers in a burn-in test mode, said second number being larger than said first number.

2. The device as set forth in claim 1, wherein each of said row decoders comprises:

an output node;

a first transistor connected between said first power supply terminal and said output node, said first transistor being turned ON by a decoder activation signal;

a plurality of second transistors, connected between said output node and said second power supply terminal, for receiving address signals; and a third transistor, connected between said output node and said second power supply terminal, for receiving a burn-in test signal.

3. The device as set forth in claim 1, wherein each of a first group of said row decoders comprises:

a first output node;

a first transistor connected between said first power supply terminal and said first output node, said first transistor being turned ON by a decoder activation signal;

a plurality of second transistors, connected between said first output node and said second power supply terminal, for receiving address signals; and a third transistor, connected between said first output node and said second power supply terminal, for receiving a burn-in test signal, and wherein each of a second group of said row decoders comprises:

a second output node;

a fourth transistor connected between said first power supply terminal and said second output node, said fourth transistor being turned ON by a decoder activation signal; and a plurality of fifth transistors, connected between said second output node and said second power supply terminal, for receiving address signals.

4. The device as set forth in claim 1, further comprising a row predecoder, connected to prestages of said row decoders, for receiving external address signals and for generating address signals by logically-combining said external address signals and transmitting said address signals to said row decoders, a part of said address signals being high in said burn-in test mode.

5. The device as set forth in claim 1, wherein each of said word line drivers comprises:

an inverter connected to one of said row decoders;

a first transistor having a drain connected to said inverter, a gate connected to said first power supply terminal, and a source;

a second transistor, having a drain connected to said word line level generating circuit, a gate connected to the source of said first transistor, and a source connected to one of said word lines; and a third transistor having a drain connected to the source of said second transistor, a gate connected to said one of said row decoders, and a source connected to said second power supply terminal.

6. A semiconductor memory device comprising:

a plurality of memory cells;

a plurality of word lines connected to said memory cells;

a word line level generating circuit for generating a word line level generating voltage higher than a power supply voltage;

a control circuit, connected to said word line level generating circuit, for feeding said word line level generating voltage back to a definite level; and a row selection means, connected to said word lines and a set-up circuit, for selecting a first number of said word lines using said word line level generating voltage in a usual mode and selecting a second number of said word lines using a set-up voltage in a burn-in test mode, said second number being larger than said first number.

7. The device as set forth in claim 6, wherein said row selection means comprises:

a plurality of word line drivers, each connected to said word line level generating circuit and one of said word lines, for driving said one of said word lines using said word line level generating voltage; and a plurality of row decoders, each connected to one of said word line drivers, for activating said one of said word line drivers, and wherein at least part of said row decoders include transistors for receiving a burn-in test signal, so that said at least part of said row decoders activate respective ones of said word line drivers when said burn-in test signal is activated.

8. The device as set forth in claim 6, wherein said row selection means comprises:

a plurality of word line drivers, each connected to said word line level generating circuit and one of said word lines, for driving said one of said word lines using said word line level generating voltage;

a plurality of row decoders, each connected to one of said word line drivers, for activating said one of said word line drivers; and a row predecoder, connected to prestages of said row decoders, for receiving external address signals and for generating address signals by logically-combining said external address signals and transmitting said address signals to said row decoders, a part of said address signals being high in said burn-in test mode.

* * * * *

UNITED STATES PATENT AND TRADEMARK OFFICE
CERTIFICATE OF CORRECTION

PATENT NO. : 5,936,910
DATED : August 10, 1999
INVENTOR(S) : Hiroaki HASHIMOTO

It is certified that error appears in the above-identified patent and that said Letters Patent is hereby corrected as shown below:

Column 4, line 6, after "$Wh_2$" insert -- . . . --.

Column 4, line 58, delete "$V_{cc}$" and insert --$V_{cc1}$--.

Column 5, line 12, delete "$_{Q24}$" and insert --$Q_{24}$--.

Column 5, line 23, delete "A2" and insert --$\overline{A2}$--.

Column 5, line 34, after "$Q_{24}$" insert --- . . . --.

Column 5, line 35, after "$N_{21}$" insert -- . . . --.

Column 5, line 37, after "$N_{22}$" insert -- . . . --.

Column 5, line 64, delete "A2·A3, A2·A3" and insert --$\overline{A2}$·A3, A2·$\overline{A3}$--.

Column 6, line 1, delete "A2·A3" and insert --A2·$\overline{A3}$--.

Signed and Sealed this

Twentieth Day of June, 2000

Attest:

Q. TODD DICKINSON

*Attesting Officer*      *Director of Patents and Trademarks*